(12) United States Patent
Kanteti et al.

(10) Patent No.: US 10,700,684 B1
(45) Date of Patent: Jun. 30, 2020

(54) BIDIRECTIONAL LEVEL TRANSLATOR HAVING NOISE REDUCTION AND IMPROVED DATA RATE

(71) Applicant: Texas Instruments Incorporated, Dallas, TX (US)

(72) Inventors: Amar Kanteti, Bangalore (IN); Ankur Kumar Singh, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/213,230

(22) Filed: Dec. 7, 2018

(51) Int. Cl.
| | |
|---|---|
| *H03K 19/003* | (2006.01) |
| *H03K 3/356* | (2006.01) |
| *H03K 3/013* | (2006.01) |
| *H03K 3/012* | (2006.01) |
| *H03K 19/0185* | (2006.01) |

(52) U.S. Cl.
CPC ....... *H03K 19/00361* (2013.01); *H03K 3/012* (2013.01); *H03K 3/013* (2013.01); *H03K 3/356113* (2013.01); *H03K 19/018521* (2013.01)

(58) Field of Classification Search
CPC ..... H03K 19/00361; H03K 19/018521; H03K 3/356113; H03K 3/012; H03K 3/013
USPC .................. 327/108, 109, 110, 111, 112, 333
See application file for complete search history.

(56) References Cited

U.S. PATENT DOCUMENTS

| | | | |
|---|---|---|---|
| 9,997,214 B1 * | 6/2018 | Kumar | ................... G11C 5/145 |
| 10,027,325 B1 | 7/2018 | Graves | |
| 10,110,231 B1 | 10/2018 | Graves | |
| 2008/0129348 A1 * | 6/2008 | Shau | .............. H03K 19/017536 327/108 |
| 2010/0237904 A1 * | 9/2010 | Shau | .............. H03K 19/018585 326/30 |
| 2015/0280714 A1 * | 10/2015 | Kumar | ............... H03K 19/0185 327/333 |

OTHER PUBLICATIONS

Spurlin, C. and Stein, D., Advanced CMOS Logic, Texas Instruments Designer's Handbook, 1988, pp. 3-1 through 3-12, Texas Instruments, Dallas, TX.
Madani, Navid, Simultaneous-Switching Noise Analysis for Texas Instruments FIFO Products, Mar. 1996, pp. 1-18, Texas Instruments, Dallas, TX.

* cited by examiner

*Primary Examiner* — John W Poos
(74) *Attorney, Agent, or Firm* — Lawrence J. Bassuk; Charles A. Brill; Frank D. Cimino

(57) ABSTRACT

A level translator translates signals between first and second voltage domains. An output buffer thereof includes a plurality of PFETs coupled in parallel between a second domain's output supply voltage and an output signal and a plurality of NFETs coupled in parallel between the output signal and the ground rail. Each gate of the plurality of PFETs is coupled to a respective first resistor; the first resistors are coupled in series and receive a first gate control signal. Each gate of the plurality of NFETs is coupled to a respective second resistor; the second resistors are coupled in series and receive a second gate control signal. A first booster NFET is coupled between the output supply voltage and the output signal and a second booster NFET is coupled between the output signal and the ground rail. The booster NFETs receive control signals that operate in the first voltage domain.

25 Claims, 8 Drawing Sheets

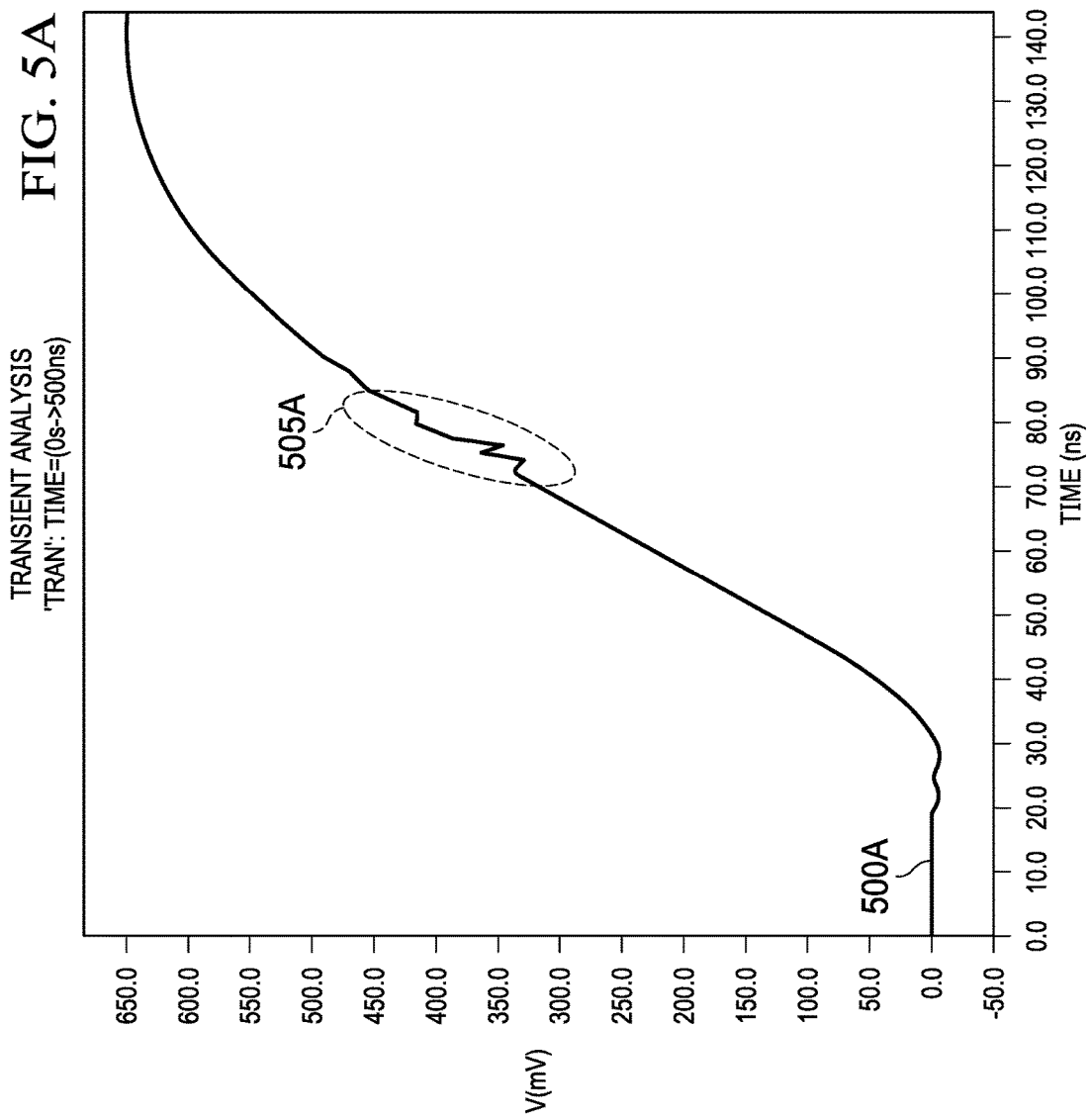

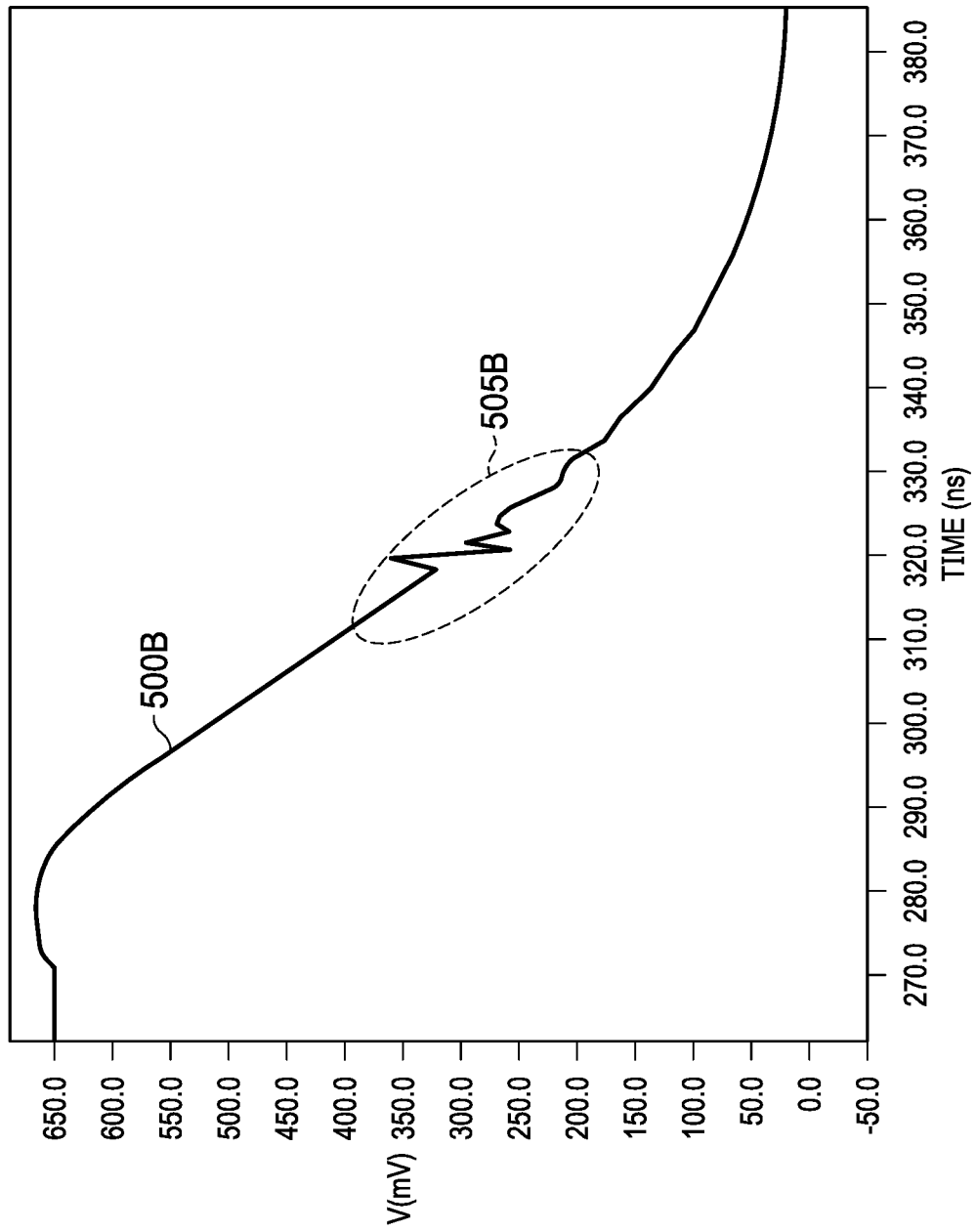

BIDIRECTIONAL LEVEL TRANSLATOR HAVING NOISE REDUCTION AND IMPROVED DATA RATE

FIELD OF THE DISCLOSURE

Disclosed embodiments relate generally to the field of voltage level translators. More particularly, and not by way of any limitation, the present disclosure is directed to a bidirectional voltage level translator having noise reduction and an improved data rate.

BACKGROUND

As the supply voltage continues to drop for advanced microcontrollers, voltage level translators that allow low voltage devices to reliably interface with legacy systems are continuing to be developed. These voltage level translators, in turn, must be capable of supporting a wide voltage range for maximum application flexibility. Existing products support a voltage range from 0.8 V to 3.6 V. However, even lower operating voltages are planned for the future.

In voltage level translators that provide bidirectional voltage translation and a number of channels, the low-to-high voltage level translator outputs generate supply and ground noise; this noise couples to the high-to-low voltage translator outputs and impacts the monotonic behavior of the output signals. Techniques to reduce the noise can reduce data rates below acceptable levels.

SUMMARY

Disclosed embodiments provide a voltage level translator that operates with voltage inputs of 3.6 volts to 0.65 volts. An output buffer for the voltage level translator combines output edge control of the output signal, also referred to as staggering, with output boosting. The staggering operates primarily for low-to-high voltage translation to reduce the noise created in this situation, while the boosting operates primarily for high-to-low voltage translation and helps to minimize the impact of any remaining noise.

In one aspect, an embodiment of a bidirectional voltage level translator chip is disclosed. The bidirectional voltage level translator chip includes a first voltage supply pin for coupling to receive a first supply voltage for a first voltage domain; a second voltage supply pin for coupling to receive a second supply voltage for a second voltage domain; a third voltage supply pin for coupling to a ground plane to provide a ground rail; a voltage level translator channel coupled to receive an input signal operating in the first voltage domain on a first pin and to provide an output signal operating in the second voltage domain on a second pin, the voltage level translator channel comprising an output buffer coupled to provide the output signal, the output buffer comprising: a low voltage threshold (Vt) P-type field effect transistor (PFET) coupled between the second supply voltage and the output signal, a gate of the low Vt PFET being coupled to be controlled by a first gate control signal; a low Vt N-type field effect transistor (NFET) coupled between the output signal and the ground rail, a gate of the low Vt NFET being coupled to be controlled by a second gate control signal; a first plurality of PFETs coupled in parallel between the second supply voltage and the output signal, the first plurality of PFETs having a standard Vt, a gate of each of the first plurality of PFETs being coupled to a respective first resistor, the respective first resistors being coupled in series and coupled to receive the first gate control signal; a first plurality of NFETs coupled in parallel between the output signal and the ground rail, the first plurality of NFETs having a standard Vt, a gate of each of the first plurality of NFETs being coupled to a respective second resistor, the respective second resistors being coupled in series and coupled to receive the second gate control signal; a third resistor coupled in series with a first booster NFET between the second supply voltage and the output signal, the first booster NFET receiving a first booster control signal on a gate; and a second booster NFET being coupled between the output signal and the ground rail, the second booster NFET receiving a second booster control signal on a gate, the first and second booster control signals operating in the first voltage domain.

In another aspect, an embodiment of an output buffer for a voltage level translator that is coupled to translate an input signal that operates in a first voltage domain that has a first supply voltage into an output signal that operates in a second voltage domain that has a second supply voltage is disclosed. The output buffer includes a first plurality of P-type field effect transistors (PFETs) coupled in parallel between the second supply voltage and the output signal, a gate of each of the first plurality of PFETs being coupled to be controlled by a first gate control signal received via a respective first resistor, the first gate control signal operating in the second domain; a first plurality of N-type field effect transistors (NFETs) coupled in parallel between the output signal and a ground rail, a gate of each of the first plurality of NFETs being coupled to be controlled by a second gate control signal received via a respective second resistor, the second gate control signal having a binary value that is the inverse of the value of the first gate control signal; a third resistor coupled in series with a first booster NFET between the second supply voltage and the output signal, the first booster NFET receiving a first booster control signal on a gate; and a second booster NFET being coupled between the output signal and the ground rail, the second booster NFET receiving a second booster control signal on a gate, the first and second booster control signals operating in the first voltage domain and having inverse binary values.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIGS. 5A and 5B depict a rising edge of a waveform and a falling edge of a waveform respectively in which noise has caused non-monotonic behavior in the output signal;

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 4:
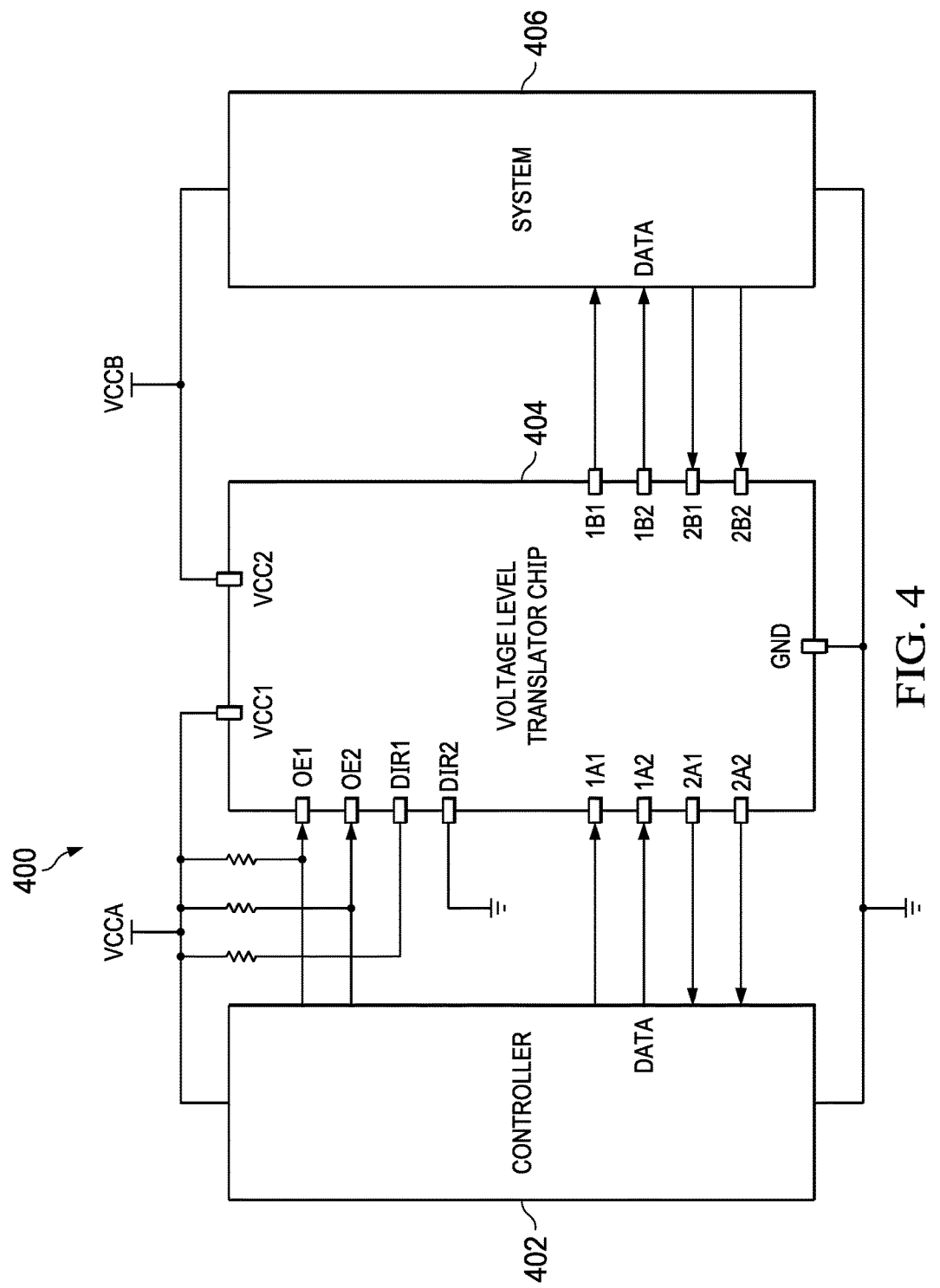
FIG. 4 illustrates a system in which an embodiment according to the disclosure can be utilized.

FIG. 4 depicts a system 400 in which a bidirectional voltage level translator chip 404 is coupled to translate the voltage level of signals passed between a controller 402 and system 406. A first voltage supply pin VCC1 is for coupling to a first voltage domain, which uses a first supply voltage VCCA that is used by controller 402; a second voltage supply pin VCC2 is for coupling to a second voltage domain, which uses a second supply voltage VCCB that is used by system 406; and a third voltage supply pin GND is for coupling to a third supply voltage, which may be a ground plane, in order to provide a lower rail. In the embodiment shown, bidirectional voltage level translator chip 404 has four channels for translation, although bidirectional voltage level translator chip 404 can also have eight, sixteen or any number of channels. Pins 1A1, 1B1 provide a first channel; pins 1A2, 1B2 provide a second channel; pins 2A1, 2B1 provide a third channel; and pins 2A2, 2B2 provide a fourth channel. In this embodiment, the first and second channels are part of a first set of channels while the third and fourth channels are part of a second set of channels.

Output-mode enable pins OE1, OE2 provide the ability to place the output buffer of a respective set of channels in a three-state output mode. This means that the output signal can exhibit three possible logic states, namely logic 1, logic 0, and an inactive (high impedance or open circuit) state. Coupling output-mode enable pin OE1 to first supply voltage VCCA places the first set of channel outputs in a three-state mode while coupling output-mode enable pin OE2 to first supply voltage VCCA places the second set of channel outputs in a three-state mode. Similarly, direction pins DIR1, DIR2 are coupled to indicate the direction of information on a respective set of channels. Coupling either of direction pins DIR1, DIR2 to first supply voltage VCCA indicates that the flow of information is from the first voltage domain to the second voltage domain, while coupling either of direction pins DIR1, DIR2 to the third supply voltage, e.g., the lower rail, indicates that the flow of information is from the second voltage domain to the first voltage domain. In the embodiment shown, all channels are placed in three-state mode, the first set of channels handles information flowing from the first voltage domain to the second voltage domain while the second set of channels handles information flowing from the second voltage domain to the first voltage domain.

Since as semiconductor devices have steadily shrunk, the voltages at which the semiconductor devices operate have grown lower, it follows that the voltages at which controller 402 and system 406 operate can depend on when the chips were created. Given the current state of the art, the supply voltages VCCA, VCCB can vary by an order of magnitude. For example, one of controller 402 and system 406 may use a voltage of 3.6V while the other uses a voltage of 0.65V. Providing the capability of translating signals between these two extremes provides numerous challenges to circuit design.

One such challenge is illustrated in FIGS. 5A and 5B, which show respectively the rising edge of output signal 500A and the falling edge of output signal 500B from a voltage translator. In each of FIGS. 5A, 5B, the monotonicity of output signals 500A, 500B is destroyed by glitches 505A, 505B respectively, which are circled in the figures. Glitches such as seen in output signals 500A, 500B are generally caused by voltage translators that are converting a signal that originates in a low voltage domain, e.g. 0.65V, to a signal in a high voltage domain, e.g., 3.6V. With multiple signals passing through a voltage level translator chip such as bidirectional voltage level translator chip 404, parasitic interactions between signal lines that lie close to each other cause the noise created by a low-to-high conversion to couple to the signals from voltage translators that are performing a high-to-low conversion. When glitches appear during the rising or falling phase of a signal, the receiver can misinterpret the signal and cause errors.

In one example, controller 402 of FIG. 4 has a first supply voltage VCCA of 3.6V and system 406 has a second supply voltage VCCB of 0.65V. The first set of channels represented by pins 1A1, 1B1, 1A2, 1B2 are configured to convert signals from A to B, i.e., 3.6V to 0.65V and the second set of channels represented by pins 2A1, 2B1, 2A2, 2B2 are configured to convert signals from B to A, i.e., 0.65V to 3.6V. The second set of channels draws a large current from supply voltage VCCA. This large current will create ground and supply bounce. If all channels are sharing the same ground and supply voltage, the outputs from the first set of channels, which are providing translation from 3.6V to 0.65V, are impacted through the noise coupling from the other channels. The occurrence of this noise during the rising or falling phases of the signal then causes misinterpretation of signals and errors.

Figure 6:
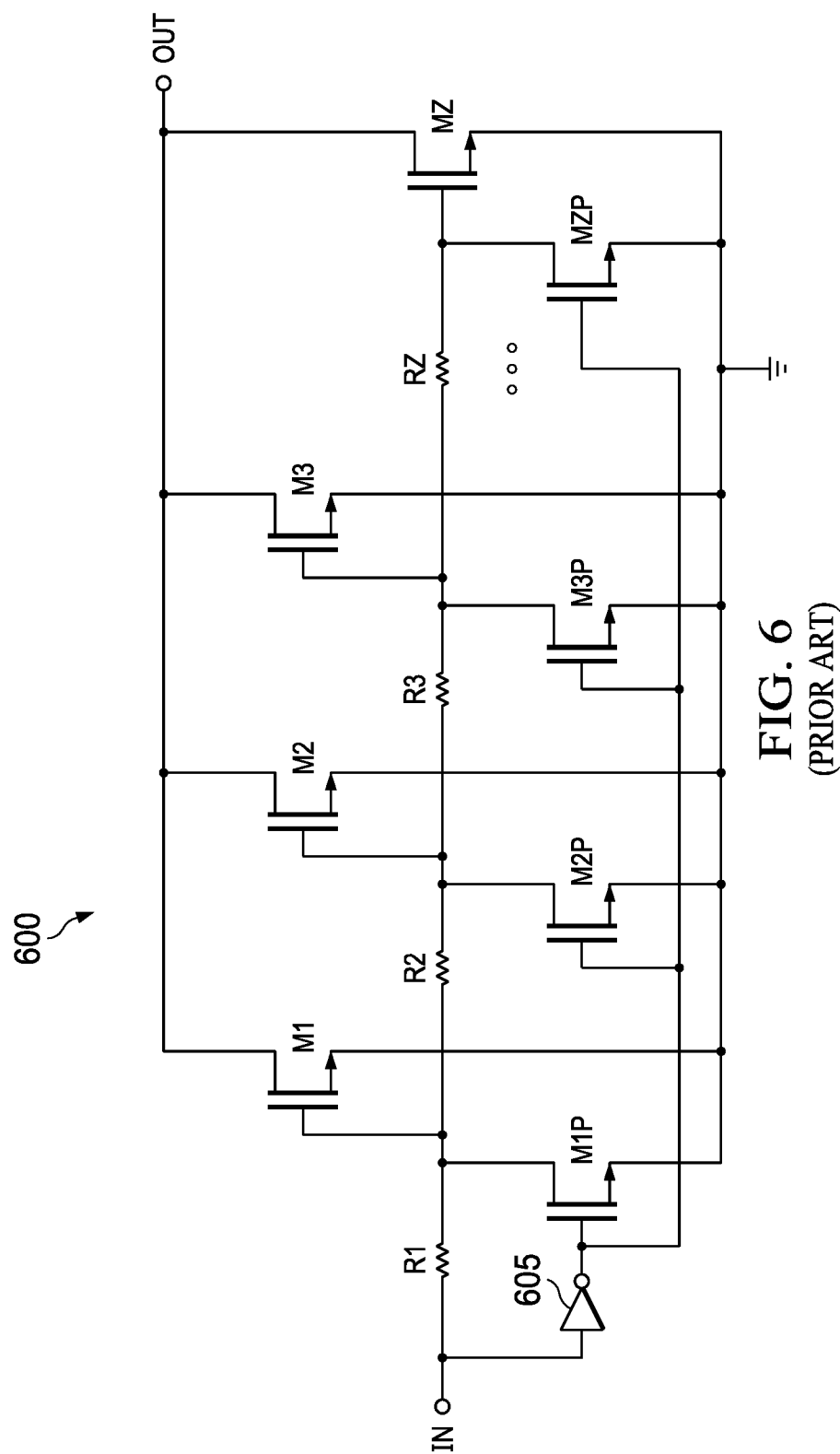
FIG. 6 depicts a schematic of a portion of an output buffer using staggering according to the prior art.

One method of decreasing the noise created by a low-to-high voltage conversion is illustrated by circuit 600 of FIG. 6, which depicts a known output edge control circuit. Circuit 600 features a sequential staging architecture that uses a number of N-type field effect transistors (NFETs) M1-MZ instead of a single transistor to provide output signal OUT. If the circuit were to have a single transistor, current in the circuit would switch from zero to peak when the transistor is switched on. In other words, the transition would be made very quickly, resulting in a signal whose leading edge has a high slew rate. The steep slope of the signal can cause overshoot or undershoot on the line due to the rapid current changes.

To avoid overshoots and undershoots caused by the rapid current changes, circuit 600 uses several sequential switching stages instead of just one. Rather than switching from zero to a peak current all at once, the delayed switching stages are able to make this transition a step at a time. At each stage in the transition the incremental increase in current becomes smaller so noise on the supply and ground will be less. Hence the noise, i.e., the non-monotonic behavior, at the output is reduced.

To accomplish the delayed switching, NFETs M1-MZ are coupled in parallel between an output signal OUT and the ground rail, while the gates of NFETs M1-MZ are coupled in series, with the gate of each of NFETs M1-MZ having a respective resistor R1-RZ coupled thereto. The combination of the resistor coupled with the capacitance inherent in the corresponding NFET gate causes a small amount of resistance/capacitance (RC) delay in the signal. When input signal IN goes high, NFET M1 will experience one unit of RC delay, NFET M2 will experience two units of RC delay, NFET M3 will experience three units of RC delay, etc. A set of pull-down NFETs M1P-MZP are each coupled between a respective gate of one of NFETs M1-MZ and the ground rail, while the gates of NFETs M1P-MZP are each coupled to input signal IN through inverter 605. When input signal IN goes low, NFETs M1P-MZP are turned on and help turn off a respective one of NFETs M1-MZ very quickly. While the techniques of output edge control, also referred to as staggering, reduce the noise produced during transitions, this technique also reduces the data rate of the block.

Figure 7:
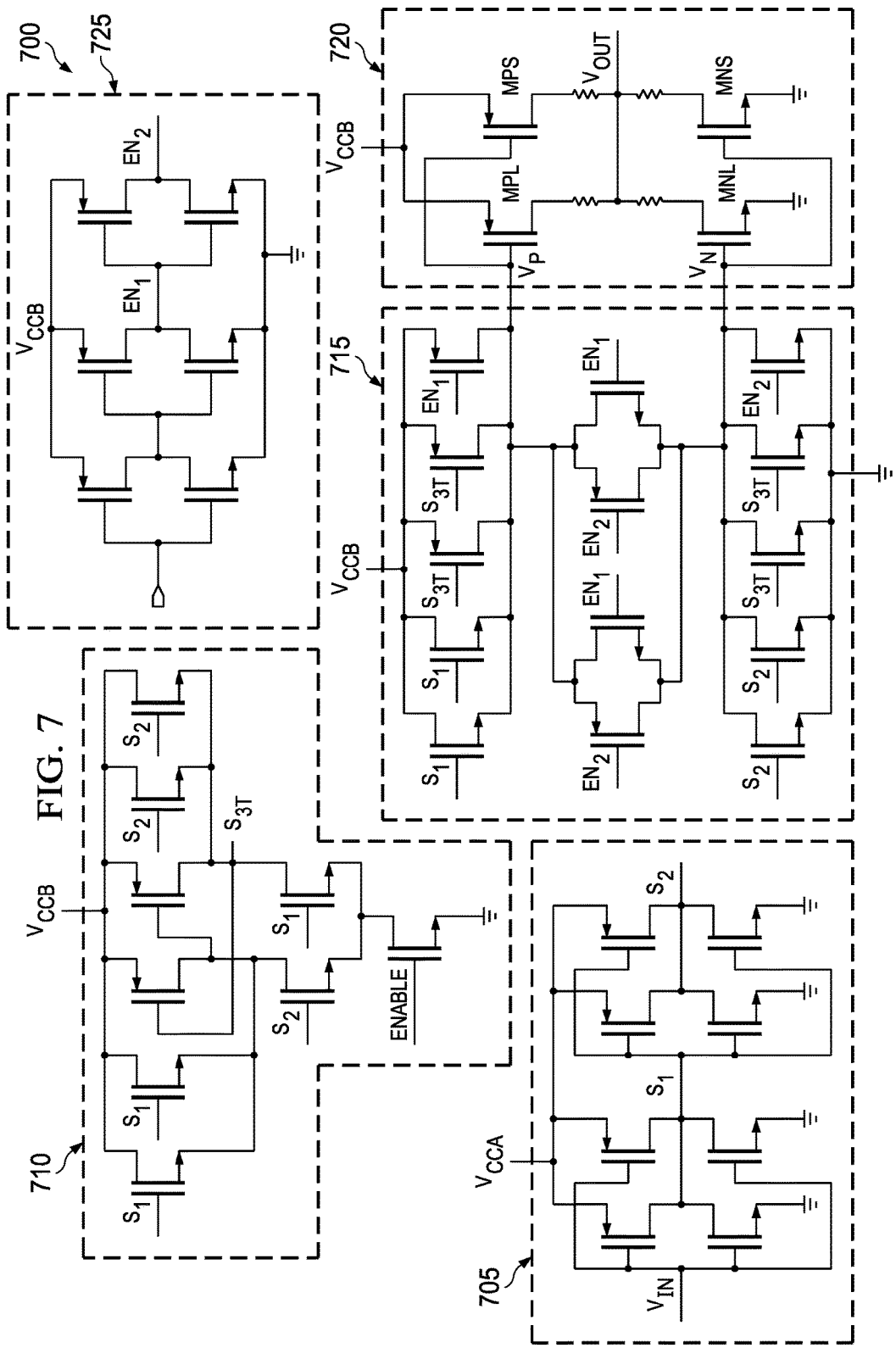
FIG. 7 depicts an example of the circuits in one channel of a bidirectional voltage level translator into which an embodiment of the disclosure can be incorporated.

FIG. 7 depicts half of an example voltage level translator channel 700 for translating a signal between the A voltage domain and the B voltage domain. The circuit shown translates a signal from the A voltage domain to the B voltage domain, while an identical circuit (not specifically shown) is coupled to translate a signal from the B voltage domain to the A voltage domain. Only one of these two circuits that make up voltage level translator channel 700 is active at a time while the output buffer of the inactive circuit is placed in a high impedance mode; the directionality of the conversion is determined by the voltage coupling of the corresponding direction pin as explained with reference to FIG. 4. FIG. 7 is taken from co-pending U.S. Pat. No. 10,027,325, issued Jul. 17, 2018 in the name of Christopher Michael Graves, which is incorporated by reference herein in its entirety. The following description provides a quick overview of these circuits; further details can be found in the patent application noted above. Voltage level translator channel 700 includes an input buffer circuit 705, a voltage translator circuit 710, gate control circuit 715, output buffer circuit 720 and enable/disable control circuit 725. Input buffer circuit 705 receives an input signal VIN, produces first control signal S1 and second control signal S2, and is the only one of the circuits that is powered by supply voltage VCCA, which is in the "A" voltage domain. First and second control signals S1 and S2 are used to drive the transistors in voltage translator circuit 710 in order to provide output control signal S3T, which is now operating in the "B" voltage domain. In gate control circuit 715, first and second control signals S1, S2 and output control signal S3T are all utilized to drive transistors in this circuit to produce gate control signals VP, VN that are passed to output buffer circuit 720. Gate control signals VP and VN control the gates of the output transistors used to provide output signal VOUT. Enable/disable circuit 725 provides enable signals EN1, EN2, which ensure that gate control signals VP and VN can place the output in high impedance state when necessary.

Because of the difficulties inherent in providing voltage translation across a wide voltage range, voltage level translator channel 700 is designed to provide a parallel threshold voltage (Vt) architecture in which low Vt transistors are coupled in parallel with standard Vt transistors. Although not specifically labeled as such, examples of low Vt transistors coupled in parallel with standard Vt transistors can be seen in each of input buffer circuit 705, voltage translator circuit 710 and gate control circuit 715, where two transistors coupled in parallel are both controlled by one of signals VIN, S1, S2, or S3T. In output buffer circuit 720, two P-type transistors, i.e., low Vt transistor MPL and standard Vt transistor MPS are coupled in parallel between second supply voltage VCCB and output signal VOUT and each receives gate control signal VP. Similarly, two N-type transistors, i.e., low Vt transistor MNL and standard Vt transistor MNS are coupled in parallel between output signal VOUT and the ground rail and each receives gate control signal VN.

The voltages that are coupled to a particular circuit for translation determines whether the standard Vt or the low Vt transistors contribute most to the conversion. For example, when a voltage of 0.65V is used for the supply voltage of a circuit, standard Vt transistors will generally not turn on and the low Vt transistors predominate. When a voltage of 3.6V is used for the supply voltage of a circuit, the low Vt transistors cannot pass enough current to provide the necessary output voltages, so the standard Vt transistors predominate in this situation.

Figure 1:
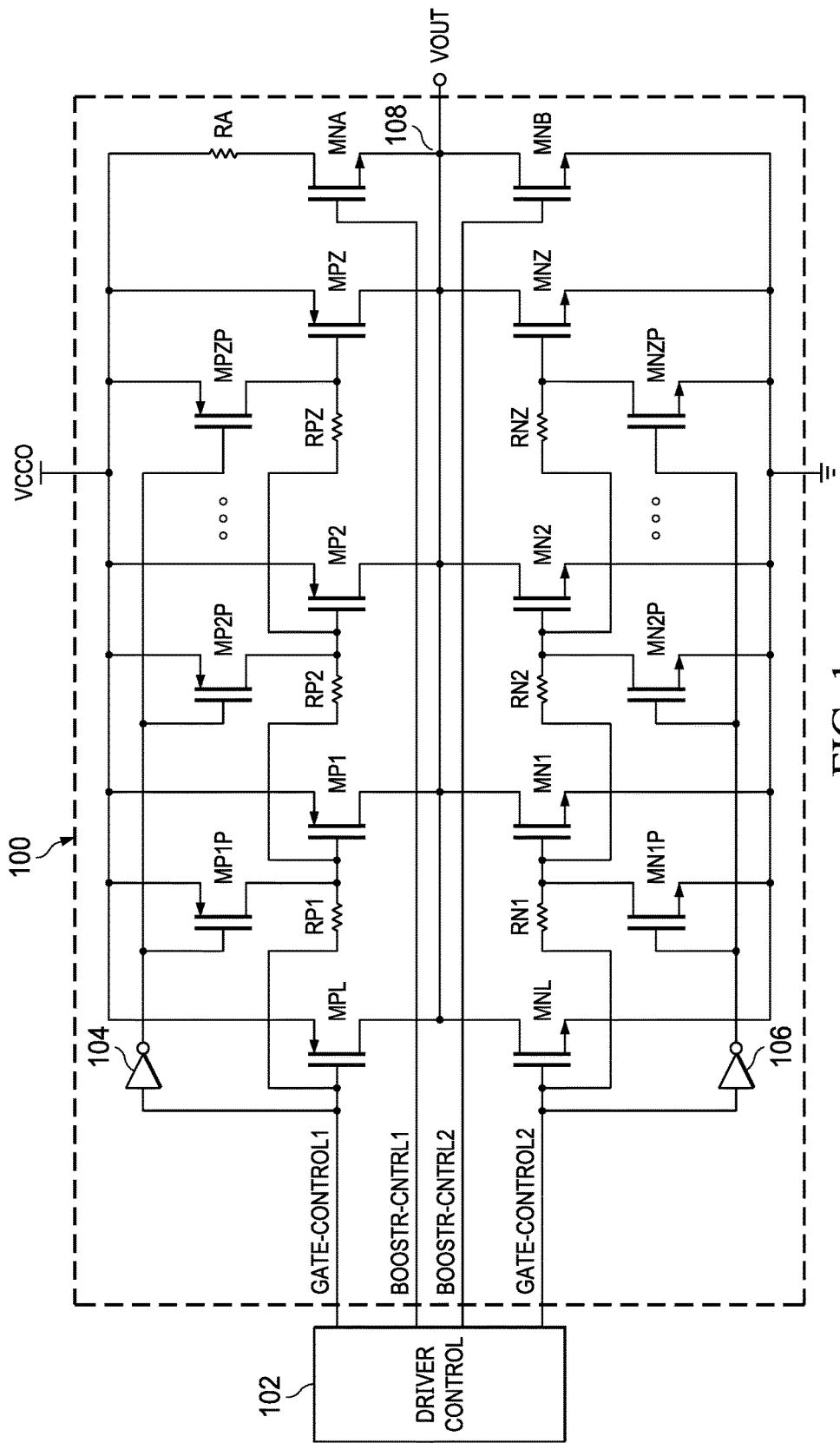
FIG. 1 depicts an example of an output buffer for a voltage level translator according to an embodiment of the disclosure.

Turning now to FIG. 1, an output buffer 100 for a voltage level translator is shown according to an embodiment of the disclosure. For the channel of which output buffer 100 is a part, voltage VCCO shown in FIG. 1 represents the upper supply voltage for the output signal VOUT, while VCCI, which is mentioned below, is the upper supply voltage for the input signal VIN shown in FIG. 7. For example, in FIG. 4, input voltage VCCI is equal to VCCA and output voltage VCCO is equal to VCCB for the first two channels represented by pins 1A1, 1B1 and 1A2, 1B2. Similarly, input voltage VCCI is equal to VCCB and output voltage VCCO is equal to VCCA for the second two channels represented by pins 2A1, 2131 and 2A2, 2B2. In this embodiment, output buffer 720 of voltage level translator channel 700 has been modified to include both staggering of the standard Vt NFETs and P-type field effect transistors (PFETs), which improves noise on high-voltage outputs, and boosting, which improves the monotonic behavior and can improve the data rate for low-voltage outputs. Output buffer 100 includes a low Vt PFET MPL and a first plurality or group of PFETs MP1-MPZ that have standard Vt and are coupled in parallel between the output supply voltage lead VCCO and the output voltage lead VOUT. The gate leads of PFETs MP1-MPZ are each coupled to a respective first resistor RP1-RPZ. The gate lead of low Vt PFET MPL, the series-coupled first resistors RP1-RPZ, and the gate leads of PFETs MP1-MPZ are coupled to receive a first gate control signal on lead GATE-CONTROL1 generated by driver control circuit 102, which in one embodiment is circuit 715 in FIG. 7. A second plurality or group of PFETs MP1P-MPZP are each coupled between the output supply voltage lead VCCO and the gate lead of a respective one of PFETs MP1-MPZ to act as pull-up transistors that can turn off the first group of PFETs MP1-MPZ quickly. Inverter 104 inverts first gate control signal GATE-CONTROL1 to provide a signal on lead that controls the gates of the second group of PFETs MP1P-MPZP.

Similarly, output buffer 100 includes a low Vt NFET MNL and a first group of standard Vt NFETs MN1-MNZ that are coupled in parallel with each other between the output voltage lead VOUT and the ground rail lead. The gate leads of NFETs MN1-MNZ are each coupled to a respective second resistor RN1-RNZ. The gate lead of low Vt NFET MNL, the series-coupled second resistors RN1-RNZ, and the gate leads of PFETs MN1-MNZ are coupled to receive a second gate control signal on lead GATE-CONTROL2 generated by driver control circuit 102. A second group of NFETs MN1P-MNZP are each coupled between the gate leads of a respective one of NFETs MN1-MNZ and the ground rail lead to act as pull-down transistors that can turn off the first group of NFETs MN1-MNZ quickly. Inverter 106 inverts second gate control signal on lead GATE-CONTROL2 to provide a signal that controls the gates of NFETs MN1P through MNZP.

A third resistor RA is coupled in series with a first booster NFET MNA and a second booster NFET MNB between the output supply voltage VCCO and the ground rail, with a point 108 between the source of NFET MNA and the drain of NFET MNB being coupled to help provide output voltage VOUT. Both first booster NFET MNA and second booster NFET MNB are standard Vt transistors. Driver control circuit 102 provides both first and second gate control signals GATE-CONTROL1, GATE-CONTROL2 and also provides two additional booster control signals BOOSTR-CNTRL1, BOOSTR-CNTRL2, which are provided respectively to the gates of first booster NFET MNA and second booster NFET MNB.

Unlike first gate control signal GATE-CONTROL1 and second gate control signal GATE-CONTROL2, which are generated in the voltage domain of output supply voltage VCCO, first booster control signal BOOSTR-CNTRL1 and second booster control signal BOOSTR-CNTRL2 are generated in the voltage domain of the input supply voltage VCCI, e.g., VCCA in FIG. 7. In one embodiment, booster control signals BOOSTR-CNTRL1, BOOSTR-CNTRL2 are the buffered signals S1 and S2 from input buffer circuit 705 if the output buffer 100 is enabled. If output buffer 100 is disabled, i.e., placed in high-impedance mode, booster signals BOOSTR-CNTRL1, BOOSTR-CNTRL2 have binary low values. When output buffer 100 is receiving an output supply voltage VCCO that is high, e.g., 3.6V, while the input supply voltage VCCI is low, e.g., 0.65V, the staggered PFETs MP1-MPZ and staggered NFETs MN1-MNZ operate to reduce noise on the supply voltages and on the lower rail. Low Vt PFET MPL and low Vt NFET MNL are fully turned on but do not pass enough current to contribute significantly to output voltage VOUT. At the same time, because first and second booster NFETs MNA, MNB are controlled by booster control signals BOOSTR-CNTRL1, BOOSTR-CNTRL2, which are produced using input supply voltage VCCI, booster NFETs MNA, MNB will not turn on, since the respective control signals do not exceed the threshold voltage for booster NFETs MNA, MNB. In the opposite situation, when input supply voltage VCCI is high, e.g., 3.6V, and the output supply voltage VCCO is low, e.g., 0.65V, the staggered PFETs MP1-MPZ and staggered NFETs MN1-MNZ will not turn on, low Vt PFET MPL and low Vt NFET MNL will turn on and booster NFETs MNA, MNB will turn on very quickly due to their strong booster control signals BOOSTR-CNTRL1, BOOSTR-CNTRL2. By switching booster NFETs MNA, MNB quickly, any noise that is received on the channel does not appear on the rising or falling edge of the signal.

Figure 2:
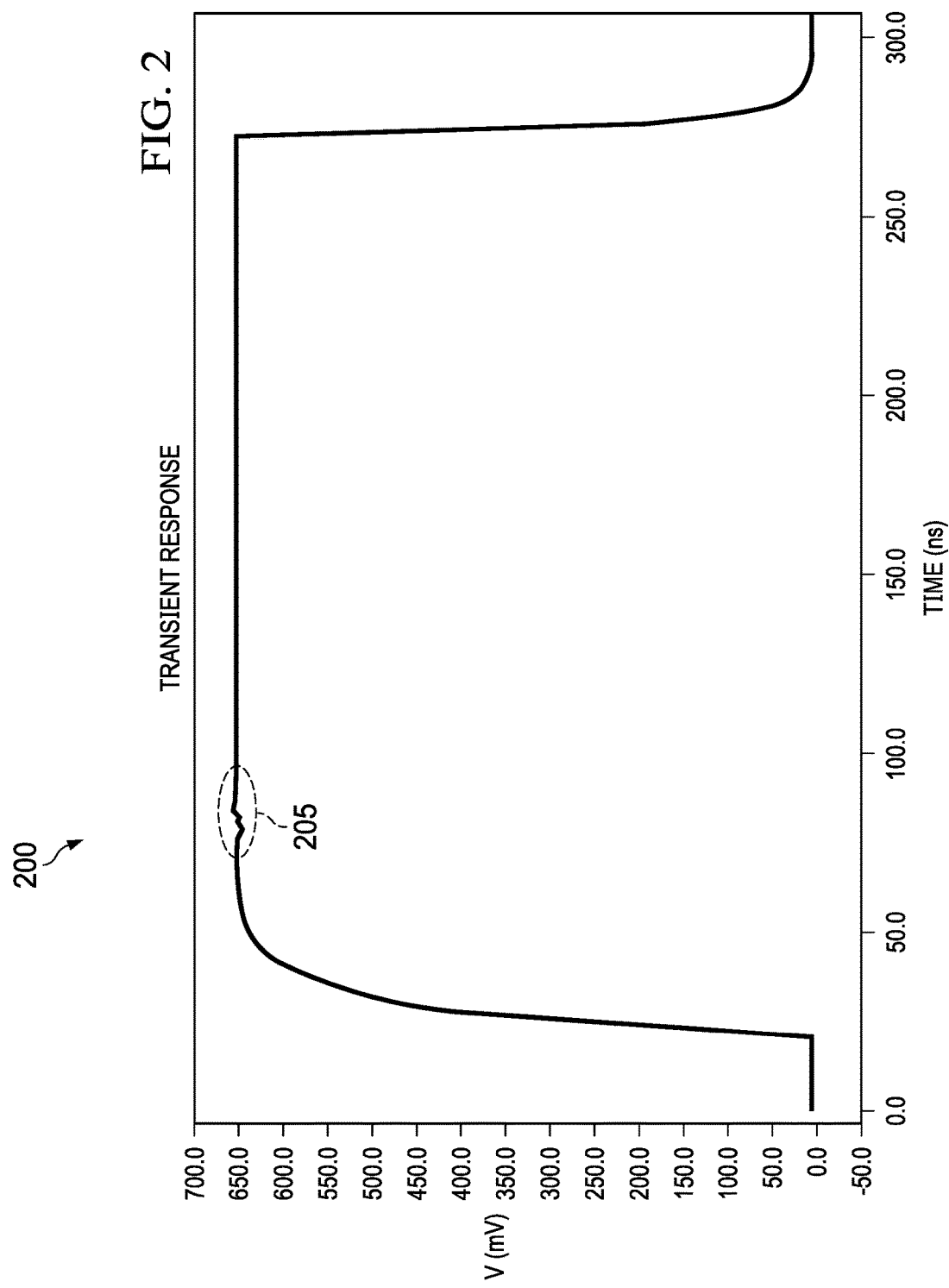
FIG. 2 depicts an example output waveform provided by an output buffer according to an embodiment of the disclosure.

FIG. 2 depicts an output waveform 200 that is produced when the output supply voltage is low while the input supply voltage is high. In this figure, some glitches 205 are seen in output waveform 200; however, because of the action of booster NFETS MNA, MNB, glitches 205 do not appear on either a rising or falling edge of output waveform 200. Monotonic behavior is preserved on signals in this channel.

Figure 3:
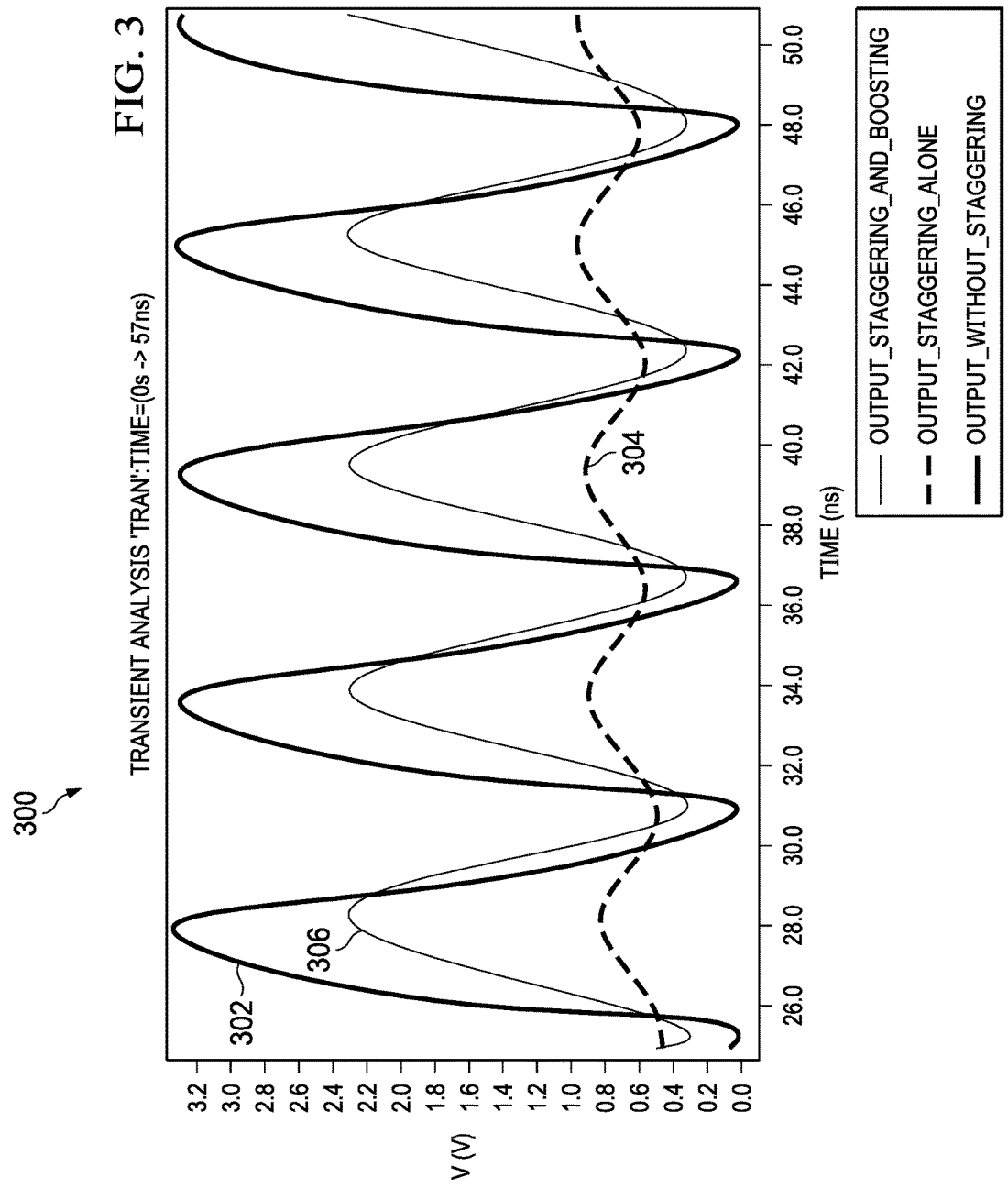
FIG. 3 depicts output signals from a voltage level translator operating in three different modes: without staggering, with staggering, and with both staggering and boosting.

FIG. 3 depicts a graph 300 illustrating simulations of the data rate for three situations, each using an input data rate of 330 MBPS. Waveform 302 occurs when no staggering is utilized and exhibits a voltage swing that allows for clear distinction between a logic high value and a logic low value. However a problem occurs when the output supply voltage is low, e.g. 0.65V, when the circuit must have a very clean supply voltage and clean ground voltage to obtain monotonic behavior in the output signal. Waveform 304 depicts when staggering alone is employed; as can be seen, the signal level is so low that a clear distinction between a logic high level and a logic low level is not available. Waveform 306 depicts when both staggering and boosting are utilized. The signal is high enough that logic high and low levels are clearly distinguishable.

When using the disclosed combination of staggering and boosting, the output for low voltage to high voltage conversions will be slowed down due to staggering, but high voltage to low voltage conversions will be somewhat faster because of the use of the high input supply voltages to drive the booster NFETs. One benefit of the combination is that the required staggered resistance can be reduced. Without a booster, the circuit would need to have a very clean supply and ground to obtain clean monotonic behavior for low supply voltages; output buffer 100 with boosting can handle more noise without affecting the monotonic behavior, so the circuit does not have to be slowed down as much as previously. At the same time the staggering resistance can be reduced. The combination of staggering and boosting using the input supply voltage for booster control provides an increased data rate and monotonic switching output. Without the use of the disclosed boosters, the circuit would have needed high resistance and a lower data rate to operate correctly.

Applicants have disclosed a multi-channel, bidirectional voltage level translator having monotonic behavior on the output signal during high-voltage-to-low-voltage translations, which reduces the sensitivity to parasitic noise from the low-voltage-to-high-voltage translations occurring on other channels of the chip. The reduced sensitivity means that the staggering resistance can be reduced. Thus, the addition of boosting to staggering provides for increased data rate during high-voltage-to-low-voltage translations while the decreased staggering resistance improves the data rate over that of staggering alone.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An output buffer circuit comprising:
  (a) a voltage input, a ground rail, and a buffer output;
  (b) a first gate control input, a second gate control input, a first boost input, and a second boost input;
  (c) a first array of transistors coupled between the voltage input and the buffer output, the first array being a sequential staging array of standard threshold voltage transistors having inputs coupled to the first gate control input;
  (d) a second array of transistors coupled between the buffer output and the ground rail, the second array of transistors being a sequential staging of standard threshold voltage transistors having inputs coupled to the second gate control input;
  (e) a first transistor having a gate coupled to the first gate control input, being a low voltage threshold transistor, and being coupled between the voltage input and the buffer output;
  (f) a second transistor having a gate coupled to the second gate control input, being a low voltage threshold transistor, and being coupled between the buffer output and the ground rail;
  (g) a third transistor having a gate coupled to the first boost input, being a standard voltage threshold transistor, and being coupled between the voltage input and the buffer output;
  (h) a fourth transistor having a gate coupled to the second boost input, being a standard voltage threshold transistor, and being coupled between the buffer output and the ground rail; and
  (i) a resistor coupled between the voltage input and the third transistor.

2. The output buffer circuit of claim 1 in which the first transistor is a P-type field effect transistor having a source and drain coupled between the voltage input and the buffer output.

3. The output buffer circuit of claim 1 in which the second transistor is an N-type field effect transistor having a drain and source coupled between the buffer output and the ground rail.

4. The output buffer circuit of claim 1 in which the third transistor is an N-type field effect transistor having a drain coupled to the resistor and a source coupled to the buffer output.

5. The output buffer circuit of claim 1 in which the fourth transistor is an N-type field effect transistor having a drain coupled to the buffer output and a source coupled to the ground rail.

6. The output buffer circuit of claim 1 in which the first array of transistors are P-type field effect transistors including:
  a first set of transistors having sources coupled to the voltage input, having drains coupled to the buffer output, and having gates coupled to the first gate control input through first array resistors; and
  a second set of transistors having sources coupled to the voltage input, drains coupled to the gates of the first set of transistors, and gates coupled to the first gate control input through an inverter.

7. The output buffer circuit of claim 1 in which the second array of transistors are N-type field effect transistors including:
  a third set of transistors having sources coupled to the ground rail, having drains coupled to the buffer output, and having gates coupled to the second gate control input through second array resistors; and
  a fourth set of transistors having sources coupled to the ground rail, drains coupled to the gates of the third set of transistors, and gates coupled to the second gate control input through an inverter.

8. The output buffer circuit of claim 1 in which the voltage input is coupled to an output voltage domain at an output voltage and the first and second gate control inputs are coupled to an input voltage domain at an input voltage different from the output voltage.

9. The output buffer circuit of claim 8 in which the output voltage is 3.6 volts and the input voltage is 0.65 volts.

10. The output buffer circuit of claim 8 in which the output voltage is 0.65 volts and the input voltage is 3.6 volts.

11. A voltage level translator circuit comprising:
  (a) a first voltage input, a second voltage input, and a ground rail;
  (b) a voltage level translator having a first boost output coupled to the first voltage input, having a second boost output coupled to the first voltage input, having a first gate control output coupled to the second voltage input, and a second gate control output coupled to the second voltage input; and
  (c) an output buffer having a buffer output, the output buffer including:
    (i) a first array of standard threshold voltage field effect transistors having control inputs coupled to the first gate control output and being coupled between the second voltage input and the buffer output;
    (ii) a first low threshold voltage field effect transistor having a control input coupled to the first gate control output and being coupled between the second voltage input and the buffer output;
    (iii) a first standard threshold voltage field effect transistor having a control input coupled to the first boost output, and being coupled between the second voltage input and the buffer output;
    (iv) a second array of standard threshold voltage field effect transistors having control inputs coupled to the second gate control output and being coupled between the buffer output and the ground rail;
    (v) a second low threshold voltage field effect transistor having a control input coupled to the second gate control output and being coupled between the buffer output and the ground rail; and
    (vi) a first standard threshold voltage field effect transistor having a control input coupled to the second boost control output, and being coupled between the buffer output and the ground rail.

12. The voltage level translator circuit of claim 11 in which the first low threshold voltage field effect transistor is a P-type field effect transistor having a source and drain coupled between the second voltage input and the buffer output.

13. The voltage level translator circuit of claim 11 in which the second low threshold voltage field effect transistor is an N-type field effect transistor having a drain and source coupled between the buffer output and the ground rail.

14. The voltage level translator circuit of claim 11 in which the first standard threshold voltage field effect transistor is an N-type field effect transistor having a drain and source coupled between the second voltage input and the buffer output.

15. The voltage level translator circuit of claim 11 in which the second standard threshold voltage field effect transistor is an N-type field effect transistor having a drain coupled to the buffer output and a source coupled to the ground rail.

16. The voltage level translator circuit of claim 11 in which:
the first array of standard threshold voltage field effect transistors are P-type field effect transistors including:
a first set of transistors having sources coupled to the second voltage input, having drains coupled to the buffer output, and having gates coupled to the first gate control output through first array resistors; and
a second set of transistors having sources coupled to the second voltage input, drains coupled to the gates of the first set of transistors, and gates coupled to the first gate control output through an inverter; and
the second array of standard threshold voltage field effect transistors are N-type field effect transistors including:
a third set of transistors having sources coupled to the ground rail, having drains coupled to the buffer output, and having gates coupled to the second gate control output through second array resistors; and
a fourth set of transistors having sources coupled to the ground rail, drains coupled to the gates of the third set of transistors, and gates coupled to the second gate control output through an inverter.

17. The voltage level translator circuit of claim 11 in which the second voltage input is at an output voltage and the first and second gate control inputs are coupled to the first voltage input at an input voltage different from the output voltage.

18. The voltage level translator circuit of claim 17 in which the output voltage is 3.6 volts and the input voltage is 0.65 volts.

19. The voltage level translator circuit of claim 17 in which the output voltage is 0.65 volts and the input voltage is 3.6 volts.

20. The voltage level translator circuit of claim 11 including a resistor coupled between the second voltage input and the first standard threshold voltage field effect transistor.

21. A process of operating a level shifting output buffer comprising:
(a) operating arrays of standard threshold voltage field effect transistors having control inputs coupled to an output supply voltage and having a buffer output coupled to the output supply voltage;
(b) operating low threshold voltage field effect transistors having control inputs coupled to the output supply voltage and having a buffer output coupled to the output supply voltage; and
(c) operating standard threshold voltage field effect transistors having control inputs coupled to an input supply voltage different from the output supply voltage, and having a buffer output coupled to the output supply voltage.

22. The process of claim 21 including applying 0.65 volts to the output supply voltage and applying 3.6 volts to the input supply voltage.

23. The process of claim 21 including applying 3.6 volts to the output supply voltage and applying 0.65 volts to the input supply voltage.

24. A level shifting output buffer comprising:
(a) a first array of standard threshold voltage field effect transistors having control inputs coupled to an output supply voltage and being coupled between an output voltage input and a buffer output;
(b) a first low threshold voltage field effect transistor having a control input coupled to the output voltage input and being coupled between the output voltage input and the buffer output; and
(c) a first standard threshold voltage field effect transistor having a control input coupled to an input voltage input different from the output voltage input, and being coupled between the output voltage input and the buffer output.

25. A level shifting output buffer comprising:
(a) a first array of standard threshold voltage field effect transistors having control inputs coupled to an output supply voltage and being coupled between a buffer output and a ground rail;
(b) a first low threshold voltage field effect transistor having a control input coupled to the output voltage input and being coupled between the buffer output and the ground rail; and
(c) a first standard threshold voltage field effect transistor having a control input coupled to an input voltage input different from the output voltage input, and being coupled between the buffer output and the ground rail.

* * * * *